United States Patent [19]
Fitzgerald et al.

[11] Patent Number: 5,795,698
[45] Date of Patent: Aug. 18, 1998

[54] ON-PRESS DEVELOPABLE PRINTING PLATE WITH AMPHOTERIC HYDROGEN BOND FORMING DEVELOPABILITY STABILIZER

[75] Inventors: Maurice J. Fitzgerald, Canton; Michael J. Jurek, Burlington; Rong-Chang Liang, Newton; Richard J. Sugrue, Quincy, all of Mass.

[73] Assignee: Polaroid Corporation, Cambridge, Mass.

[21] Appl. No.: 817,369

[22] PCT Filed: Sep. 13, 1996

Related U.S. Application Data

[60] Provisional application No. 60/005,446, Oct. 6, 1995.

[86] PCT No.: PCT/US96/14611

§ 371 Date: Apr. 14, 1997

§ 102(e) Date: Apr. 14, 1997

[51] Int. Cl.[6] .................. G03C 1/1725; B41N 1/00
[52] U.S. Cl. .................. 430/281.1; 430/288.1; 430/302; 101/456
[58] Field of Search .................. 430/288.1, 302, 430/281.1; 101/456

[56] References Cited

U.S. PATENT DOCUMENTS

| | | | |
|---|---|---|---|
| 5,607,816 | 3/1997 | Fitzgerald et al. | 430/271.1 |
| 5,677,110 | 10/1997 | Chia et al. | 430/302 |

FOREIGN PATENT DOCUMENTS

| | | |
|---|---|---|
| 0263366 | 9/1987 | European Pat. Off. |
| WO95/12836 | 5/1995 | WIPO . |
| WO95/12837 | 5/1995 | WIPO . |

OTHER PUBLICATIONS

PCT International Search Report for PCT/US96/14611 (Form PCT/ISA/210) (mailed Mar. 10, 1997).

*Primary Examiner*—Janet C. Baxter
*Assistant Examiner*—Rosemary Ashton
*Attorney, Agent, or Firm*—Renato M. de Luna

[57] ABSTRACT

The present invention discloses a lithographic printing plate developable on a lithographic printing press equipped with means for delivering lithographic ink and aqueous fountain solutions to the printing plate, the lithographic printing plate having in order (a) a printing plate substrate; and (b) a photoresist photohardenable upon imagewise exposure to actinic radiation, the photoresist comprising (i) a macromolecular organic binder; (ii) a photopolymerizable ethylenically unsaturated monomer having at least one terminal ethylenic group capable of forming a high polymer by chain-propagated polymerization, (iii) a polymerization initiator activatable by actinic radiation, and (iv) an amphoteric hydrogen bond-forming developability stabilizer, the hydrogen bond-forming developability stabilizer being nonvolatile miscible in the photoresist and soluble in said lithographic ink and fountain solutions; the amphoteric hydrogen bond-forming developability stabilizer possessing a strong hydrogen bond-forming functional group with the remainder of the molecule manifesting hydrophilicity.

4 Claims, No Drawings

ON-PRESS DEVELOPABLE PRINTING PLATE WITH AMPHOTERIC HYDROGEN BOND FORMING DEVELOPABILITY STABILIZER

FIELD OF THE INVENTION

The present invention relates generally to photoresist compositions suitable for on-press development, and more particularly, to the incorporation of amphoteric hydrogen bond-forming developability stabilizers in the photoresists of lithographic printing plates for the purpose of promoting their on-press developability.

BACKGROUND

At the present time, virtually all printed copy is produced through the use of three basic types of printing plates. One type is a relief plate which prints from a raised surface. Another type is an intaglio plate which prints from a depressed surface. The third type is a lithographic plate which prints from a substantially flat surface which is neither appreciably raised above nor appreciably depressed below the adjacent and surrounding non-printing areas. Printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

Prior to processing for use, conventional lithographic plates will typically have a hydrophobic, photoreactive polymeric photoresist (i.e., photoresist) coated or otherwise deposited atop a hydrophilic substrate.

In preparing a conventional lithographic plate for use on a printing press, the plate is first exposed to actinic radiation. Specific chemical reactions are caused to occur in the plate's photoresist by expo sure to actinic radiation. Such photoinduced chemical reactions may either reduce or enhance the solubility of the photoresist, depending on whether the resist is negative-working or positive-working. In negative-working plates, exposure to actinic radiation will generally cause a "hardening" of the photoresist. In positive-working plates, exposure to actinic radiation will generally cause a softening or solubilization of the photoresist.

After photoexposure, a wet development step is normally conducted. The objective of such wet development is to remove those areas of the photoresist which have undergone photoinduced chemical change or those which have not been photoexposed. Solvation under conventional development techniques will typically involve treating the exposed plate with organic solvents in a developing bath. For negative-working resists, the solvent will swell and dissolve the unexposed portions of the resist. The solvent should not swell the exposed portions or distortion of the developed image may result. For positive-working resists, the response of the unexposed and exposed coatings are reversed, but the same general principles apply.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing. The aforementioned hydrophilic non-image areas correspond to uncovered portions of the substrate. The image and non-image areas thus differentiated, the processed plate may then be mounted onto a printing press and run.

Encumbered by required wet development, the processing of conventional lithographic plates prior to their use on a printing press is both time and labor consuming and involves considerable use of organic chemicals. It will be appreciated that there is a considerable desire for means that would satisfactorily eliminate or reduce conventional lithography's long-felt dependency upon the conduct of wet development and thereby permit use of lithographic plates on a printing press immediately after exposure without required post-exposure prepress processing.

In the past, dry developable lithographic printing plates have been suggested which enable the wet processing steps of lithographic printing plates after exposure to be omitted and printing to be conducted by directly mounting the exposed plates on a printing press. Among printing plates that may be characterized as on-press developable (or related thereto) are: e.g., U.S. Pat. No. 4,273,851, issued to Muzyczko et al. on Jun. 16, 1981; U.S. Pat. No. 5,258,263, issued to Z. K. Cheema, A. C. Giudice, E. L. Langlais, and C. F. St. Jacques on Nov. 2, 1993; and U.S. Pat. No. 5,395,734, issued to Vogel et al. on Mar. 7, 1995.

Despite the methodologies and approaches embodied in the aforementioned patents, there is a continuing need for a lithographic printing plate that can be readily developed on a printing press and that produces a plate having durable image areas needed for good run length. Applications for such on-press developable printing plates have been filed. U.S. Pat. Nos. 5,556,924 and 5,514,522, describe a photoreactive polymeric binder that may be used to enhance photospeed in either conventional plates or on-press developable lithographic printing plates. Briefly, a polymer of m-isopropenyl-α,α-dimethylbenzyl isocyanate is derivatized for vinyl group reactivity by reacting the isocyanate groups thereof with a hydroxyalkyl acrylate, such as 4-hydroxybutyl acrylate. The resulting photopolymeric binder provides higher photospeed than compositions containing non-reactive binders typically utilized in the production of printing plates. Lithographic printing plates utilizing the photoreactive polymeric binder have good durability (as manifested by good run-length) and can be developed using relatively weak developers. As to the preparation of the photoreactive binders, the applications describe a method of copolymerizing m-isopropenyl-α,α-dimethylbenzyl isocyanate through complexation with an electron-deficient monomer (e.g., maleic anhydride) to accelerate free radical copolymerization with other monomers. The maleic anhydride accelerated process is kinetically more efficient and provides greater monomer-to-polymer conversion. Use of the resulting product in the photoresist of a lithographic printing plate improves its adhesion. The disclosures of commonly assigned U.S. Pat. Nos. 5,556,924 and 5,514,522 are hereby incorporated by reference.

U.S. Pat. No. 5,607,816, describes the use of plasticizers, surfactants and lithium salts as development aids for negative-working, on-press developable lithographic printing plates. Briefly, plasticizers, which are dispersible or soluble in press fountain solutions and soluble in acrylic monomers and oligomers, are incorporated into a photoresist. Such plasticizers make the photoresist more permeable to fountain solution prior to crosslinking, while being easily extracted with ink and fountain solution after crosslinking. The surfactants facilitate the dispersion of hydrophobic imaging compositions in the fountain solution and reduce scumming. Further, lithium salts may also be incorporated into the photoresist to disrupt hydrogen bonding of, for example, urethane acrylate polymers which tend to associate by hydrogen bonding, thus enhancing developability. The disclosure of commonly assigned U.S. Pat. No. 5,607,816 is hereby incorporated by reference.

U.S. Pat. No. 5,616,449, describes the use of rubbers and surfactants to enhance the durability of on-press developable printing plates. The rubbers are preferably incorporated into a photoresist as discrete rubber particles. To ensure a uniform and stable dispersion, the rubber components are suspended in the photoresist preferably by means of surfactants having HLBs approximately between 7.0 and 18.0. The disclosure of commonly assigned U.S. Pat. No. 5,616,449, is hereby incorporated by reference.

While the practice of the subject matter set forth in the aforementioned applications can produce suitable "on-press" developable printing plates, for so-called "long-run" plates, the subject matter is desirably combined with that of U.S. Pat. 5,516,620. U.S. Pat. No. 5,516,620 describes a lithographic printing plate for use on a printing press, with minimal or no additional required processing after exposure to actinic radiation. Plate embodiments comprise a printing plate substrate, a polymeric resist layer capable of image-wise photodegradation or photohardening, and a plurality of microencapsulated developers capable of blanket-wise promoting the washing out of either exposed or unexposed areas of the polymeric resist. The microencapsulated developers may be integrated into the polymeric resist layer, or may form a separate layer deposited atop the polymeric resist layer, or—in certain other embodiments—may be coated onto a separate substrate capable of being brought into face-to-face contact with the resist layer.

Further, among the aforementioned applications, mention may also be made of U.S. Pat. No. 5,561,029 issued to Maurice J. Fitzgerald, Donna J. Guarrera, John M. Hardin, Frederick R. Kearney, Rong-Chang Liang, William C. Schwarzel, and John C. Warner; U.S. Pat. No. 5,559,650, issued to Daoshen Bi, Maurice J. Fitzgerald, Frederick R. Kearney, Rong-Chang Liang, William C. Schwarzel, and Tung-Feng Yeh and U.S. Pat. No. 5,579,607, issued to Yee-Ho Chia, Joseph Hanlon, John M. Hardin, Rong-Chang Liang, Yi-Hua Tsao, and Tung-Feng Yeh. Each of these applications are commonly assigned and are incorporated herein by reference.

While the on-press plate development strategies mentioned in the aforementioned applications provide good results, upon extended exposure to elevated temperatures, loss of good on-press developability (and resolution) may be observed to a degree in certain of the resultant lithographic printing plates. Thus, for example, whereas an on-press developable printing plate freshly prepared may be on-press developed relatively easily, the same plate left in a 60° C. oven for an extended period of time may require several revolutions of the printing press before "clean" images (i.e., with little of no "scumming") are produced. "Scumming", as is known, occurs when ink collects on non-image areas of a printing plate (i.e., the hydrophilic, oleophobic areas resultant of the uncovering of a lithographic substrate in a negative-working printing plate) and transferred to a receiving medium.

With the present invention directed to preventing said loss of developability, it has been found that incorporation of one or more of the ether-carboxylic acid, and/or ureido, amide, or lactam developability stabilizers disclosed herein (particularly 3,6-dioxaheptanoic acid, DHTA) into the photoresist of an on-press developable lithographic printing plate improves developability stability, and importantly, without impairing durability or effecting fountain-ink balance when the printing plate is developed on-press.

While the present inventors do not wish to be bound to any theory in explanation of their invention, the results obtained by the addition of these select developability stabilizers are believed to be resultant of several mechanisms, the mechanisms acting alone or in combination.

First, in certain printing plates where undesirable developability over time was observed, the plate was noted to comprise a specially treated polar surface coated with a photoresist containing several components having both hydrogen bond-donating and hydrogen bond-accepting moieties. In these plates, the major sources of these groups contributing to the loss in developability were its ester-containing binders and its photoactive binder (i.e., the aforementioned derivatized polymer of m-isopropenyl-α,α-dimethylbenzyl isocyanate) with its urethane linkages. Polymers containing urethane groups are well known for developing ordered structures, over time, through hydrogen bonding. It is believed that the use of small molecules that can form hydrogen bonds (and thus compete for available hydrogen bonding sites) break up this ordered structure. Further, with the use of a fountain and ink soluble or dispersible hydrophilic hydrogen bond former, such as DHTA, the effect is reversible upon on-press development. The hydrogen bond former is dissolved and the urethane linkages are reformed, thus effecting improved and/or maintained durability.

Second, in other printing plates where undesirable developability over time was observed, the aluminum oxide surface of the printing plate's substrate was noted to be treated with poly(vinyl phosphonic acid) or silicated. Excess phosphonic acid groups at the air—coating interface affords a polar surface to preserve the hydrophilicity of the non-image area and to promote adhesion of the polar image coat onto it in subsequent steps. With time, the acid groups may change conformation towards the basic alumina surface of the printing plate by hydrogen bonding or acid-base interaction, resulting in scumming or toning in the non image-areas. In place of a polar-surface, the non-polar backbone of the poly(vinyl phosphonic acid) would be facing outward. (Similar reactions are believed to occur—albeit to a lesser degree—in silicated printing plate substrates.) The use of small, hydrogen bonding molecules (such as DHTA) could effectively compete with the phosphonic acid group of poly(vinyl phosphonic acid) for the active sites on the aluminum oxide surface, preventing the rearrangement and adsorption of these polar phosphonic groups. The amphoteric nature of an additive such as DHTA may be of further use when competing with the phosphonic acid groups for bonding sites on an alumina surface. As the acidic end (the 'head') bonds to the alumina, the 'tail' is also polar and preserves the hydrophilicity of the alumina surface, in contrast to the case with the poly(vinyl phosphonic acid).

And third, the basic dimethylamino group of the leuco dye(s) used in the photoresists of the aforementioned plates may cause it to block the hydrophilic phosphorous—OH bond, thus converting the surface to the very hydrophobic triarylmethane moiety. DHTA may compete with the surface phosphonic groups for the dimethylamino leuco dye (by protonation or hydrogen bonding) and preserve the hydrophilicity of the alumina surface. The resultant DHTA-dye complex is hydrophilic and miscible with the photoresist. Other strong acids such as sulfuric acid or phosphoric acid are also useful to protonate the basic leuco dyes. However, they often result in leuco dye salts of poor solubility in the photoresist or compounds of high surface activity (such as dodecylbenzene sulfonate), which in turn results in poor durability or adhesion of the image area.

SUMMARY OF THE INVENTION

The present invention provides a lithographic printing plate developable on a lithographic printing press equipped with means for delivering lithographic ink and aqueous fountain solutions to the printing plate, the lithographic printing plate having in order (a) a printing plate substrate; and (b) a photoresist photohardenable upon imagewise exposure to actinic radiation, the photoresist comprising at least (i) a macromolecular organic binder; (ii) a photopolymerizable ethylenically unsaturated monomer having at least one terminal ethylenic group capable of forming a high polymer by chain-propagated polymerization, (iii) a polymerization initiator activatable by actinic radiation, and (iv) an amphoteric hydrogen bond-forming developability stabilizer, the hydrogen bond-forming developability stabilizer being non-volatile, miscible in the photoresist, and soluble in said lithographic ink and fountain solutions; the amphoteric hydrogen bond-forming developability stabilizer possessing a strong hydrogen bond-forming functional group with the remainder of the molecule manifesting hydrophilicity.

It is an object of the present invention to provide an on-press developable lithographic printing plate having good on-press developability over time.

It is an object of the present invention to provide an on-press-developable lithographic printing plate having good shelf-life stability.

It is an object of the present invention to provide a lithographic printing plate with a photoresist having polymeric binders with urethane groups, the developability over time of said plate being improved significantly without impairing its durability or its effect on fountain-ink balance when used on a printing press.

It is an object of the present invention to provide an on-press developable lithographic printing plate having incorporated into the photoresist thereof an amphoteric hydrogen bond-forming developability stabilizer, the hydrogen bond-forming developability stabilizer being a compound that is non-volatile miscible in the photoresist and soluble in conventional lithographic ink or fountain solutions; the amphoteric hydrogen bond-forming developability stabilizer possessing a strong hydrogen bonding functionality with the remainder of the molecule manifesting hydrophilicity.

It is an object of the present invention to provide an on-press developable lithographic printing plate having incorporated into the photoresist thereof an amphoteric hydrogen bond-forming developability stabilizer, amphoteric hydrogen bond-forming developability stabilizer being a compound having the formula R(OCH$_2$CH$_2$)$_n$BX, wherein n is an integer from 1 to 20, B is, when present, an alkyl, oxaalkyl, aryl, oxaaryl, cycloalkyl, or oxacycloakyl group, X is a functional group capable of participating in a hydrogen bond, and R is hydrogen, methyl, or ethyl.

It is an object of the present invention to provide an on-press developable lithographic printing plate having 3,6-dioxeheptanoic acid incorporated into the photoresist thereof.

It is an object of the present invention to provide an on-press developable lithographic printing plate having 3,6,9-trioxadecanoic acid incorporated into the photoresist thereof.

DETAILED DESCRIPTION OF THE INVENTIVE SUBJECT MATTER

Throughout this disclosure the term "on-press" is used to describe both development and printing plates, (e.g "on-press development", "developing on-press", "on-press developable lithographic printing plates", etc.) As used herein, the modifier "on-press" will be defined as indicating an ability to develop a useful imagewise distribution of oleophilic and hydrophobic polymeric areas on a printing press after imagewise exposure, without resort to wet development steps or like intermediary processing. "On-press" techniques should be contrasted with other so-called "dry development" techniques: e.g., dry collotype and laser ablation techniques, wherein oleophilic and hydrophobic image areas are formed at exposure; and peel-apart and thermal transfer techniques, wherein oleophilic and hydrophilic image areas are formed after a laminar separation.

The present invention provides a lithographic printing plate capable of being developed on a lithographic printing press immediately after imagewise exposure. The lithographic printing plate is characterized by good post-exposure developability that remains relatively stable over time. The lithographic printing plate comprises a printing plate substrate and a photoresist photohardenable upon imagewise exposure to actinic radiation deposited thereon. In particular, the photoresist used for the present invention comprises a macromolecular organic binder; a photopolymerizable ethylenically unsaturated monomer having at least one terminal ethylenic group capable of forming a high polymer by chain-propagated polymerization, a polymerization initiator activatable by actinic radiation, and—most importantly—an amphoteric hydrogen bond-forming developability stabilizer.

The preferred amphoteric hydrogen bond-forming developability stabilizers are compounds that are miscible with the photoresist, and are relatively non-volatile. In accord with their amphoteric nature, the developability stabilizers useful for the present invention will possess a strong hydrogen bonding site with the remainder of the molecule manifests hydrophilicity. Preferred developability stabilizers are molecules that contain ethylene oxide units and have both a hydrophilic functionality and an acid or base functionality capable of participating in the formation of a hydrogen bond. Such molecules may be represented by the formula R(OCH$_2$CH$_2$)$_n$BX, wherein n is an integer from 1 to 20, B is optional, but when present is an alkyl, oxaalkyl, aryl, oxaaryl, cycloalkyl, or oxacycloalkyl group (e.g. —CH$_2$, —C$_6$H$_{10}$, —C$_6$H$_4$, —OCH$_2$ etc.), X is an acidic or basic functional group capable of participating in the formation of a hydrogen bond, and R is hydrogen, methyl, or ethyl. Regarding the acidic or basic functional groups, X can be, e.g., —COOH, —PO$_3$H$_2$, —PO$_4$H$_2$, —SO$_3$H, —SO$_2$H, —SO$_4$H, —NR$_2$R$_3$ (wherein R$_2$ and R$_3$ are alkyl), -Pyridine, —C(O)NH$_2$, —C(S)NH$_2$, —NHC(O)NH$_2$, —NHC(S)NH$_2$, or their organic salts. 3,6-dioxaheptanoic acid is an especially preferred developability stabilizer (see, Examples 3 and 4, infra). 3,6,9-trioxadecanoic acid also provides good results (e.g., Examples 5 and 6, infra). When used, 3,6-dioxaheptanoic acid is preferably incorporated at a concentration of approximately 0.2 to 5.0% by weight of the dry film, and even more preferable, between 0.5 and 3.0% by weight of the dry film.

In preparing a photoresist composition according to the present invention, the hydrogen bond-forming developability stabilizer is incorporated into a photoresist typically comprising at least a binder, a polymerizable monomer, and an initiator. The preferred photoresist is prepared from a photoresist composition comprising the stated ingredients in an organic solvent, such as methyl ethyl ketone, cyclohexanone, and 1-butanol. As a solvent based resist, when developed on-press, remnants of the removed resist will be "taken up" by the press ink solution. Accordingly, contamination of the press fountain solution (and the concomitant degradation of print quality) is avoided.

The polymerizable monomer may include any variety of compounds, mixtures, or mixtures of reaction compounds or materials capable of being physically altered by photoexposure or of promoting physical alteration (e.g., hardening) of the properties of the layer in areas of photoexposure. Compounds and materials suitable for this purpose include monomeric photopolymerizable compounds which undergo free-radical or cation-initiated polymerization. A large number of useful compounds is available, generally characterized by a plurality of terminal ethylenic groups.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a high polymer by free-radical initiated, chain-propagated polymerization. Examples of such unsaturated compounds include acrylates, acrylamides, methacrylates, methacrylamides, alkyd compounds, vinyl ethers, vinyl esters, N-vinyl compounds, styrene, crotonates and the like. Polymerization can be effected by using a photoinitiator, such as a free-radical generating, addition polymerization-initiating system activatable by actinic radiation. Such initiating systems are known and examples thereof are described below.

Preferred polymerizable monomers are the polyfunctional acrylate monomers such as the acrylate and methacrylate esters of ethylene glycol, trimethylolpropane and pentaerythritol. These can be polymerized in exposed regions of a polymeric photoresist in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyronitrile and azo-bis4-cyanopentanoic acid, although others can be employed.

The practical concentration of the monomer or monomers employed is about 7.5%–70% by weight based on the total solids of the composition, and preferably between 15–40%.

Another principal component of the polymeric photoresist for most plates is a solvent-soluble hydrophobic binder of suitable oleophilicity and ink receptivity. Suitable binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g., vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

The photoresist composition of the present invention can be suitably coated into a layer which, upon photoexposure, undergoes hardening as the result of polymerization of the polymerizable monomer and grafting of the monomer onto the polymeric binder. If desired, other crosslinking agents, such as bis-azides and polythiols, can be included to promote crosslinking of the polymerizable monomers or the binders.

If desired, preformed polymers having pendant pyridium ylide groups, which groups, upon photoexposure, undergo ring expansion (photorearrangement) to a diazepine group with accompanying insolubilization can also be blended with the photoreactive polymer of this invention. Examples of polymers having such pyridium ylide groups are set forth in U.S. Pat. No. 4,670,528, issued to L. D. Taylor and M. K. Haubs on Jun. 2, 1987.

To prepare a lithographic plate according to the present invention, the photoresist composition is coated as a layer onto a substrate. Certain factors are considered in determining the appropriate materials for the substrate. Such factors vary with the particular lithographic needs of individual projects and are believed to be within the grasp of one skilled in the pertinent art. Regardless, for most lithographic needs envisioned, suitable substrates will generally include those to which the polymeric resist layer can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of the photoresist, or to increase the hydrophilic properties of the substrate material, and/or to improve the developability of the photosensitive coating, as is described in the U.S. Pat. No. 4,492,616 (issued Jan. 8, 1985 to E. Pliefke, et al.). Thus, the substrate can be treated (for example, by polyvinylphosphonic acid or silicate or by anodization, or by corona discharge or plasma treatment, or by roughening or graining treatment) to promote desired adhesion of any polymeric resist layers.

Especially preferred substrates are the metallic substrates of aluminum, zinc, or steel. Other preferred substrates are silicone rubbers and metallized plastic sheets such as those based on poly(ethylene terephthalate).

Preferred plates are the grained, anodized aluminum plates, where the surface of the plate is roughened mechanically or chemically (e.g., electrochemically) by a combination of roughening treatments. Anodized plates can be used to provide an oxide surface. Other desirable plates are anodized aluminum plates which, for example, have been treated with polyvinylphosphonic acid or otherwise provided with a resinous or polymeric hydrophilic layer.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghauser, et al.); the aforementioned U.S. Pat. No. 4,492,616 issued to E. Pliefke, et al; U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

It is common practice in preparing photoresist compositions to employ photosensitizers, coinitiators, and activators. Photosensitizers and coinitiators are relied upon to capture photons of exposing radiation. They may absorb light of different wavelengths from the principal photoinitiator. The activator in contrast is not relied upon to respond directly to exposing radiation, but rather adjacent activator and photosensitizer molecules react, following excitation of the latter by photon capture, causing release of a free radical which in turn induces immobilization addition reactions at sites of ethylenic unsaturation.

Photoexposure of the printing plates can be accomplished according to the requirements dictated by the particular composition of the polymeric photoresist and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of the photoresist can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in exposed (or non-exposed) areas by developers. It will be appreciated, as stated above, that the use of the dispersed particulate rubber of the present invention enables the use of comparatively thinner photoresists. When utilizing an anodized, grained aluminum substrate, good results are obtained by using a polymeric photoresist having a thickness in the range of from about 0.2 microns to about 3 microns above the microstructure of the grains, preferably about 0.2 to 0.6 microns "above the grain".

A polymeric photoresist can be provided with colorants, e.g. tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of mounting and running the photoexposed plate on a printing press.

In addition, the operability of the polymeric photoresist may be improved by the addition of certain additives. For example, the polymeric photoresist can contain plasticizers, additional hardeners, or other agents to improve coatability. The polymeric photoresist may also contain antioxidant materials to prevent undesired (premature) polymerization and examples include derivatives of hydroquinone; methoxy hydroquinone; 2,6-di-(t-butyl)4-methylphenol; 2,2'-methylene-bis-(4-methyl-6-t-butylphenol); tetrakis {methylene-3-(3', 5'-di-t-butyl4'-hydroxyphenyl)propionate} methane; diesters of thiodipropionic acid, triarylphosphite. While the use of such additives is unnecessary for the operability of the present invention, incorporation of such additives may dramatically enhance performance.

The plasticizers, contrast dyes, imaging dyes and other additives may be microencapsulated and incorporated into the photoresist itself or a separate layer facially positioned or positionable atop the photoresist. Inclusion in the microcapsules would provides a wider latitude in the selection of such additives, since neither the solubility of the additives in the photopolymerizable compositions nor the inhibition or retardation effect of some additives on polymerization would be an issue in such a system.

Development of a photoexposed plate of the invention can be accomplished in a number of ways, depending upon the particular nature of the photoresist employed. For example, in the case of a negative-working photoresist based upon photopolymerizable ethylenically unsaturated monomers, conventional wet development can be employed using a diluted alkaline solution containing preferably up to 10% by volume of organic solvents. Examples of useful alkaline compounds include inorganic compounds such as sodium hydroxide, potassium hydroxide, lithium hydroxide, sodium benzoate, sodium silicate and sodium bicarbonate; and organic compounds such as ammonia, monoethanolamine, diethanolamine and triethanoloamine. Water-soluble organic solvents useful as developers include isopropyl alcohol, benzyl alcohol, ethyl cellosolve, butyl cellosolve, diacetone alcohol, and the like. Depending on the particular needs, the developing solution may contain surfactants, dyes, salts for inhibiting the swelling of the photoresist, or salts for corroding the metal substrate.

As another means of development, it is noted that embodiments of the present invention may be operably on-press developed without any further treatment after exposure, development being accomplished on the printing press by the action of fountain solution and lithographic ink. In particular, using for example the methods of offset lithography, the printing plate can be mounted on a plate cylinder of the press which, as it rotates, comes into contact successively with rollers wet by a fountain solution and rollers wet by ink. The fountain and ink solution (sprayed or otherwise deposited onto dampening rollers and inking rollers, respectively) contacts the plate, leading to the aforediscussed interaction of the fountain and ink solutions with the photoresist. Ultimately, the fountain solution contacts the non-printing areas of the plate and prevents ink from contacting these areas. The ink likewise contacts the image areas and is subsequently transferred to an intermediate blanket cylinder. The inked image is transferred to the receiving medium (e.g., paper) as it passes between the intermediate blanket cylinder and an impression cylinder.

While the on-press developable plates of the present invention are suitable for many printing applications, the plates can be improved in respect of on-press developability by suitably modifying the photoresist composition or treating the photoresist layer for improved removability on the press. For example, good results may be accomplished using dispersed rubbers, as described in the above cross-referenced U.S. Pat. No. 5,616,449, in a photoresist that is in contact or brought into contact with the microencapsulated developer systems, as described in the above cross-referenced U.S. Pat. No. 5,516,620. A photoresist may also incorporate a plasticizing system and a photoreactive polymeric binder, as described in the above cross-referenced U.S. Pat. Nos. 5,607,816, 5,514,522, and 5,556,924. Combinations with these on-press development systems and those described in the other patent applications cross-referenced herein are the suggested modes of utilization.

The present invention will now be described in further detail by the following non-limiting examples of several of its embodiments. In the examples, Radcure Ebecryl PU 8301 is a hexafunctional urethane acrylate oligomer, Elvacite 2042 (from du Pont) is a high molecular weight poly(ethyl methacrylate), Sartomer SR399 is a dipentaerythrytol (pentacrylate), Rohm & Haas A-11 is a polymethylmethacrylate resin, Rohm & Haas B-72 is a poly(ethyl methacrylate-co-methyl acrylate) resin, Irganox 1035 (from Ciba-Geigy) is an antioxidant, Aerosol OT is a dialkyl ester of sodium sulfosuccinic acid, and TX-100 is an alkylphenolethylene oxide adduct. Unless otherwise indicated, all parts, percents, ratios and the like are by weight.

EXAMPLES

Example 1

A hydrophobic photoresist was deposited, at a coverage of from 80 to 110 mg/ft$^2$, onto an 8 mil (0.2 mm) hydrophilic aluminum substrate that 5 had been electrochemically grained, anodized and treated with polyvinylphosphonic acid. The photoresist (coated @ 5.50% solids from a solvent mixture of 88/12% of 2-propanone and cyclohexanone) is formulated as shown in the following Table 1—1.

TABLE 1-1

Preparation of Photoresist Formulation

| Component | wt % in Dry Film | Gms. Solvent |
|---|---|---|
| Acryloid Resin A-11 (from Rohm and Haas) | 6.50 | — |
| Acryloid Resin B-72 (from Rohm and Haas) | 14.00 | — |
| Photoreactive Acrylic Binder[α] Oligomer/Monomer | 10.00 | — |
| Ebecryl 8301 Oligomer (from Radcure) | 6.72 | — |
| Dipentaerythritol pentacrylate, Sartomer SR399 | 44.39 | — |
| 3-benzoyl-7-methoxy coumarin | 1.40 | — |
| 4-benzoyl-4-methyl diphenyl sulfide | 1.80 | — |
| s-triazine[β] | 2.50 | — |
| Pluronic L43 (surfactant from BASF) | 4.80 | — |
| 3,6-dioxaheptanoic acid (DHTA) | 2.00 | — |
| 2-Propanone | — | 52.47 |
| Cyclohexanone | — | 5.34 |
| Bis OMLEV[x] | 3.30 | — |
| 2,6-di-tert-butyl-4-methyl phenol (BHT) | 0.73 | — |
| Irganox 1035 (antioxidant from Ciba-Geigy) | 0.26 | — |
| Leuco crystal violet | 2.00 | — |
| TOTAL | 100.00 | |
| TOTAL SOLIDS | 5.50 | |
| TOTAL SOLVENTS | 94.50 | |

Notes:
[α]The photoreactive acrylic binder contains methyl methacrylate, butyl methacrylate, maleic anhydride, and TMI adduct with hydroxybutyl acrylate. See, U.S. Pat. Nos. 5,514,522 and 5,556,924
[β]2-[p-(n-heptylaminocarbonyl)phenyl]-4,6-bis(trichloromethyl)-1,3,5-triazine;
[x]bis(4-diethylamino-o-tolyl)-4-diethylamino phenylmethane.

The plate was then overcoated with a 0.25 μm thick protective overcoat. The overcoat formulation was prepared as shown in the following Table 1-2.

TABLE 1-2

Preparation of Overcoat Formulation

| Component | wt % in Dry Film |
|---|---|
| EMA-ASA-TEMPO, Na[α] | 22.00 |
| Polyvinyl alcohol (Airvol 205 from Air Products) | 62.50 |
| Pluronic L43 (surfactant from BASF) | 5.00 |
| Sucrose | 6.00 |
| Aerosol OT | 3.00 |
| Triton X-100 | 1.05 |
| Water | — |
| TOTAL | 100.00 |

Notes:
[α]Sodium salt of 2-aminoethyl sufonate and 4-amino, TEMPO substituted poly(ethylene-maleic anhydride). See U.S. Pat. No. 5,599,650

The coated plate was aged in a 60° C. oven for 24 hours then exposed to actinic radiation from a standard mercury halide lamp, the lamp having an emission peak in the ultraviolet range of 362 to 365 nm. The photoexposed plate was then used on a lithographic printing press without additional processing, e.g., washing or gumming. Printed pages from a printing plate employing this formulation were compared to a control image coat, the control image coat being essentially identical except for the absence of DHTA. The DHTA-containing formulation produced "clean" images relatively immediately (ie., after a few printed pages), whereas "clean" images required the printing of over 100 pages using the control plate.

Example 2

A hydrophobic photoresist was deposited, at a coverage of from 80 to 110 mg/ft$^2$, onto an 8 mil (0.2 mm) hydrophilic aluminum substrate that had been electrochemically grained, anodized and treated with polyvinylphosphonic acid. The photoresist (coated @ 5.50% solids from a solvent mixture of 88/12% of 2-propanone and cyclohexanone) is formulated as shown in the following Table 2-1.

TABLE 2-1

Preparation of Photoresist Formulation

| Component | Wt % in Dry Film |
|---|---|
| Acryloid Resin A-11 (from Rohm and Haas) | 12.00 |
| Acryloid Resin B-72 (from Rohm and Haas) | 0.00 |
| Photoreactive Acrylic Binder[α] Oligomer/Monomer | 18.50 |
| Ebecryl 8301 Oligomer (from Radcure) | 6.97 |
| Dipentaerythritol pentacrylate, Sartomer SR399 | 47.88 |
| 3-benzoyl-7-methoxy coumarin | 1.40 |
| 4-benzoyl-4-methyl diphenyl sulfide | 0.00 |
| s-triazine[β] | 2.50 |
| Pluronic L43 Surfactant (from BASF) | 4.80 |
| 3,6-dioxaheptanoic acid (DHTA) | 2.00 |
| 2-Propanone | — |
| Cyclohexanone | — |
| Bis OMLEV[x] | 1.98 |
| 2,6-di-tert-butyl-4-methyl phenol (BHT) | 0.48 |
| Irganox 1035 (antioxidant from Ciba-Geigy) | 0.17 |
| Leuco crystal violet | 1.32 |
| TOTAL | 100.00 |
| TOTAL SOLIDS | 5.50 |
| TOTAL SOLVENTS | 94.50 |

Notes:
[α]The photoreactive acrylic binder contains methyl methacrylate, butyl methacrylate, maleic anhydride and TMI adduct with hydroxybutyl acrylate. See, U.S. Pat. Nos. 5,514,522 and 5,556,924;
[β]2-[p-(n-heptylaminocarbonyl)phenyl]-4,6-bis(trichloromethyl)-1,3,5-triazine;
[x]bis(4-diethylamino-o-tolyl)-4-diethylamino phenylmethane.

As in Example 1, the plate was then overcoated with a 0.25 μm thick protective overcoat. The overcoat formulation was prepared as shown in the following Table 2—2.

TABLE 2-2

Preparation of Overcoat Formulation

| Component | wt % in Dry Film |
|---|---|
| EMA-ASA-TEMPO, Na[α] | 22.00 |
| Polyvinyl alcohol (Airvol 205 from Air Products) | 62.50 |
| Pluronic L43 Surfactant (from BASF) | 5.00 |
| Sucrose | 6.00 |
| Aerosol OT | 3.00 |
| Triton X-100 | 1.05 |
| Water | — |
| TOTAL | 100.00 |

Notes:
[α]Sodium salt of 2-aminoethyl sufonate and 4-amino, TEMPO substituted poly(ethylene-maleic anhydride). See U.S. Pat. No. 5,599,650.

As in Example 1, the coated plate was aged in a 60° C. oven for 24 hours then exposed to actinic radiation from a standard mercury halide lamp, the lamp having an emission peak in the ultraviolet range of 362 to 365 nm. The photoexposed plate was then used on a lithographic printing press without additional processing, e.g., washing or gumming. Printed pages from a printing plate employing this formulation were compared to a control image coat, the control image coat being essentially identical except for the absence of DHTA. As in Example 1, the DHTA-containing formulation produced "clean" images relatively immediately (ie., after a few printed pages), whereas "clean" images required the printing of over 100 pages using the control plate.

Examples 3 to 10

Photoresist solutions were made by adding a hydrogen bond-forming developability stabilizer to the following base formulation (7% solids in 85/15 MEK/cyclohexanone):

| Component | Wt % in dry Film |
|---|---|
| Photoreactive Acrylic Binder* | 56.12 |
| Dipentaerythritol pentacrylate, Sartomer SR399 | 32.61 |
| 3-benzoyl-7-methoxy coumarin | 1.63 |
| s-triazine** | 2.55 |
| Leuco Crystal Violet Dye | 3.37 |
| 2,6-di-tert-butyl-4-menthyl phenol (BHT) | 0.49 |
| Irganox 1035 (Ciba-Geigy) | 0.17 |
| Pluronic L43 Surfactant (BASF) | 3.06 |

*The photoreactive binder contained methyl methacrylate, butyl methacrylate, maleic anhydride, and an m-TMI adduct with hydroxybutyl acrylate. See, U.S. Pat. Nos. 5,514,522 and 5,556,924, cross-referenced above.
**2-[p-(n-heptylaminocarbonyl)phenyl]-4,6-bis(trichloromethyl)-1,3,5-triazine.

In particular, 3,6-dioxaheptanoic acid was incorporated into the base formulation at 0.5% dry film (Example 3) and 2.0% dry film (Example 4); 3,6,9-trioxadecanoic acid was incorporated into the base formulation at 0.5% dry film (Example 5) and 2.0% dry film (Example 6); 3,6,9-trioxaundecanedioic acid was incorporated into the base formulation at 0.5% dry film (Example 7) and 2.0% dry film (Example 8); and polyglycol diacid was incorporated into the base formulation at 0.5% dry film (Example 9) and 2.0% dry film (Example 10). A control composition was prepared without incorporation therein of a hydrogen bond-forming developability stabilizer.

The photoresist compositions were spin coated onto an anodized aluminum plate, exposed to actinic radiation, then on-press developed. In these particular examples, on-press development of the photoresist was facilitated by laminating a microcapsule-bearing developer sheet onto the printing plate prior to mounting on the printing press, the microcapsules containing a high-boiling, low-vapor pressure developer (diethyl adipate). Reference can be made to the afore-discussed U.S. Pat. No. 5,516,620 for a description of the manufacture and use of microcapsule-bearing developer sheet.

Examples 3 to 10 were evaluated in comparison to the control. Observations of the $D_{min}$ ink density range for the samples stored at 60° C. before on-press development over varying time periods are summarized in the following table.

| Developability Stabilizer | Wt % dry film | $D_{min}$ Density Range 0 h | 24 h | 168 h |
|---|---|---|---|---|
| None (Control) | 0.0 | 0.00 | 0.01–0.02 | 0.03–1.18 |
| 3,6-dioxaheptanoic acid (Example 3) | 0.5 | 0.00 | 0.00 | 0.00 |
| 3,6-dioxaheptanoic acid (Example 4) | 2.0 | 0.00 | 0.00 | 0.00 |
| 3,6,9-trioxadecanoic acid (Example 5) | 0.5 | 0.00 | 0.00 | 0.00 |
| 3,6,9-trioxadecanoic acid (Example 6) | 2.0 | 0.00 | 0.00 | 0.00 |
| 3,6,9-trioxaundecanedioic acid (Example 7) | 0.5 | 0.00 | 0.00 | 0.00–0.62 |
| 3,6,9-trioxaundecanedioic acid (Example 8) | 2.0 | 0.00 | 0.00 | 0.06–0.65 |
| Polyglycol diacid (Example 9) | 0.5 | 0.00 | 0.00 | 0.00–0.02 |
| Polyglycol diacid (Example 10) | 2.0 | 0.00 | 0.00 | 0.01–0.64 |

We claim:

1. A lithographic printing plate developable on a lithographic printing press equipped with means for delivering lithographic ink and aqueous fountain solutions to the printing plate, the lithographic printing plate having in order (a) a printing plate substrate; and
   (b) a photoresist photohardenable upon imagewise exposure to actinic radiation, the photoresist comprising
      (i) a macromolecular organic binder;
      (ii) a photopolymerizable ethylenically unsaturated monomer having at least one terminal ethylenic group capable of forming a high polymer by chain-propagated polymerization,
      (iii) a polymerization initiator activatable by actinic radiation, and
      (iv) an amphoteric hydrogen bond-forming developability stabilizer, the hydrogen bond-forming developability stabilizer being a compound that is non-volatile, miscible in the photoresist, and soluble in said lithographic ink and fountain solutions; the amphoteric hydrogen bond-forming developability stabilizer possessing a strong hydrogen bonding functionality with the remainder of the molecule manifesting hydrophilicity.

2. The lithographic printing plate of the claim 1, wherein the amphoteric hydrogen bond-forming developability stabilizer is a compound having the formula R(OCH$_2$CH$_2$)$_n$BX, wherein n is an integer from 1 to 20, B is optional, but when present, an alkyl, oxaalkyl, aryl, oxaaryl, cycloalkyl, or oxacycloalkyl group, X is a functional group capable of participating in a hydrogen bond, and R is hydrogen, methyl, or ethyl.

3. The lithographic printing plate of claim 2, wherein the hydrogen bond-forming developability stabilizer is 3,6-dioxaheptanoic acid.

4. The lithographic printing plate of claim 2, wherein the hydrogen bond-forming developability stabilizer is 3,6,9-trioxadecanoic acid.

* * * * *